US010832892B2

(12) United States Patent
Takahashi et al.

(10) Patent No.: US 10,832,892 B2
(45) Date of Patent: Nov. 10, 2020

(54) ANTENNA, PLASMA PROCESSING DEVICE AND PLASMA PROCESSING METHOD

(71) Applicant: Tokyo Electron Limited, Tokyo (JP)

(72) Inventors: Kazuki Takahashi, Miyagi (JP); Yuki Kawada, Miyagi (JP); Naoki Matsumoto, Miyagi (JP); Takahiro Senda, Miyagi (JP); Koji Koyama, Miyagi (JP); Shohei Fukano, Miyagi (JP); Jun Yoshikawa, Miyagi (JP); Hiroyuki Kondo, Miyagi (JP); Takashi Minakawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/478,770

(22) PCT Filed: Jan. 4, 2018

(86) PCT No.: PCT/JP2018/000020
§ 371 (c)(1),
(2) Date: Jul. 17, 2019

(87) PCT Pub. No.: WO2018/135307
PCT Pub. Date: Jul. 26, 2018

(65) Prior Publication Data
US 2020/0058468 A1 Feb. 20, 2020

(30) Foreign Application Priority Data
Jan. 18, 2017 (JP) .................................. 2017-006768

(51) Int. Cl.
*H01J 37/32* (2006.01)
*H05H 1/46* (2006.01)

(52) U.S. Cl.
CPC .... *H01J 37/3222* (2013.01); *H01J 37/32238* (2013.01); *H01J 37/32522* (2013.01); *H05H 1/46* (2013.01)

(58) Field of Classification Search
CPC ............. H01J 37/3222; H01J 37/32119; H01J 37/32238; H01J 37/32522;
(Continued)

(56) References Cited

U.S. PATENT DOCUMENTS

2015/0087162 A1* 3/2015 Matsumoto ....... H01J 37/32192
438/798

FOREIGN PATENT DOCUMENTS

| JP | 2013-243218 A | 12/2013 |
| JP | 2015-018687 A | 1/2015 |

OTHER PUBLICATIONS

International Search Report issued in PCT/JP2018/000020; dated Feb. 13, 2018.

* cited by examiner

*Primary Examiner* — Henry Luong
(74) *Attorney, Agent, or Firm* — Studebaker & Brackett PC

(57) ABSTRACT

An antenna according to an aspect includes: a dielectric window having a first surface and a second surface, the second surface having an annular recessed surface and a flat surface surrounded by the recessed surface; a slot plate; a dielectric plate; a heat transfer member made of metal and having an upper surface and a lower surface opposing each other; a cooling jacket; and a heater, in which the upper surface includes a plurality of first regions and a second region, the cooling jacket is mounted on the plurality of first regions, the second region is recessed further toward the lower surface side than the plurality of first regions, the heater is mounted on the second region, and each of the (Continued)

plurality of first regions is provided at a position at least partially overlapping with the flat surface when viewed in a direction parallel to a central axis.

18 Claims, 6 Drawing Sheets

(58) Field of Classification Search
CPC .......... H01J 37/32357; H01J 37/32366; H01J 37/32394; H01J 37/32403; H01J 37/32211; H01J 2237/002; H01J 2237/32; H01J 2237/332; H01J 2237/334; H05H 1/24; H05H 1/46
See application file for complete search history.

ANTENNA, PLASMA PROCESSING DEVICE AND PLASMA PROCESSING METHOD

TECHNICAL FIELD

Embodiments of the present invention relate to an antenna, a plasma processing apparatus, and a plasma processing method.

BACKGROUND ART

In the manufacture of an electronic device such as a semiconductor device, plasma processing on a workpiece, for example, processing to etch the workpiece is performed. In the plasma processing, a processing gas is excited in a chamber by energy supplied from a plasma source. As a plasma processing apparatus used for such plasma processing, in recent years, a plasma processing apparatus having a radial line slot antenna has been developed (see Patent Literature 1).

The plasma processing apparatus described in Patent Literature 1 includes a chamber body, a stage, a microwave generator, and an antenna. The antenna includes an antenna which includes a dielectric window, a slot plate, and a cooling jacket. The dielectric window is made of quartz and is provided above the stage. The slot plate is installed on the dielectric window. A first slot group and a second slot group are formed in the slot plate. The first slot group is composed of a plurality of slot pairs arranged along a circumferential direction with respect to the central axis of the slot plate. The second slot group is composed of a plurality of slot pairs arranged along the circumferential direction with respect to the central axis of the slot plate outside the first slot group. A substantially spiral heater is disposed inside the first slot group. Annular heaters are respectively disposed between the first slot group and the second slot group, and outside the second slot group. The cooling jacket is installed on the slot plate with the dielectric plate interposed therebetween. A flow path for a refrigerant is formed in the interior of the cooling jacket. The plasma processing apparatus described in Patent Literature 1 supplies microwaves generated by the microwave generator to the antenna. The antenna emits microwaves for generating plasma, based on the microwaves from the microwave generator.

During the plasma processing of the workpiece, the dielectric window is heated by heat input from the plasma. Therefore, in a case where a plurality of workpieces belonging to the same lot are plasma-processed in order, there is a case where a difference occurs between the temperature of the dielectric window when the first workpiece of the same lot is processed and the temperature of the dielectric window when the second and subsequent workpieces are processed. If a difference occurs in the temperature of the dielectric window, variation occurs in the degrees of processing of the workpieces within the same lot. In contrast, in the apparatus described in Patent Literature 1, when the plasma processing is not performed, the dielectric window is heated by using the heater, whereby the occurrence of variation in the degrees of processing of the workpieces belonging to the same lot is suppressed.

CITATION LIST

Patent Literature

[Patent Literature 1] Japanese Unexamined Patent Publication No. 2013-243218

SUMMARY OF INVENTION

Technical Problem

As described above, in Patent Literature 1, when the plasma processing is not performed, the dielectric window is heated by the heater. On the other hand, during the plasma processing, it is conceivable to cool the dielectric window by using the cooling jacket in order to maintain the temperature of the dielectric window at a predetermined temperature. However, since the thermal resistance between the cooling jacket and the dielectric window increases at the position where the heater is formed, there is a concern that the cooling of the dielectric window may become uneven.

Therefore, in this technical field, it is required to suppress the non-uniformity of cooling of the dielectric window during plasma processing while suppressing a difference between the temperature of the dielectric window during the plasma processing and the temperature of the dielectric window when the plasma processing is not performed.

Solution to Problem

An antenna according to an aspect includes a dielectric window having a first surface and a second surface extending on a side opposite to the first surface, the second surface having an annular recessed surface extending around a central axis and recessed toward the first surface side, and a flat surface surrounded by the recessed surface, a slot plate provided on the first surface, a dielectric plate provided on the slot plate, a heat transfer member made of metal, having an upper surface and a lower surface opposing to each other, and sandwiching the dielectric plate between the lower surface and the slot plate, a cooling jacket provided on the heat transfer member, and a heater provided between the heat transfer member and the cooling jacket, in which the upper surface includes a plurality of first regions and a second region, the cooling jacket is mounted on the plurality of first regions, the second region is recessed further toward the lower surface side than the plurality of first regions, the heater is mounted on the second region, and each of the plurality of first regions is provided at a position at least partially overlapping the flat surface when viewed in a direction parallel to the central axis.

In the antenna according to the aspect, by heating the dielectric window by using the heater, it is possible to suppress lowering of the temperature of the dielectric window. Therefore, in a case where this antenna is mounted on a plasma processing apparatus as a microwave introduction mechanism, it is possible to suppress a difference between the temperature of the dielectric window during the plasma processing and the temperature of the dielectric window when the plasma processing is not performed.

On the other hand, during the plasma processing, the dielectric window is cooled by the cooling jacket. Here, the maximum thickness between the first surface and the second surface of the dielectric window at the position where the flat surface is formed is larger than the maximum thickness between the first surface and the second surface of the dielectric window at the position where the recessed surface is formed. The portion having a large thickness, of the dielectric window, is harder to change in temperature than the portion having a small thickness. Therefore, if cooling is uniformly performed on the dielectric window, the temperature of the portion having a large thickness, of the dielectric window, that is, the portion where the flat surface is formed, is not easily lowered, and therefore, there is a concern that the temperature distribution of the dielectric window may become uneven. In contrast, in the antenna according to the aspect, each of the plurality of first regions at least partially overlaps the flat surface when viewed in the direction of the central axis. Since the cooling jacket is mounted on the plurality of first regions, in the antenna according to the aspect, the portion where the flat surface is formed, of the dielectric window, is efficiently cooled. Accordingly, in the antenna according to the aspect, it is possible to suppress the non-uniformity of cooling of the dielectric window during the plasma processing.

In an embodiment, the recessed surface may include a bottom surface, an inner inclined surface connecting the bottom surface and the flat surface and inclined to become more distant from the first surface as it comes closer to the flat surface, and an outer inclined surface extending from the bottom surface to the outer side and inclined to become more distant from the first surface as it comes closer to an outer edge of the dielectric window, and a plurality of slot holes arranged in a circumferential direction with respect to the central axis may be formed in the slot plate, and each of the plurality of slot holes may be formed at a position overlapping the inner inclined surface when viewed in the direction parallel to the central axis.

In an embodiment, the first surface may define two annular grooves extending to surround the plurality of slot holes when viewed in the direction parallel to the central axis, and an annular conductor may be provided in each of the two annular grooves. By disposing the annular conductor extending to surround the plurality of slots, it is possible to concentrate an electric field immediately below the plurality of slot holes.

In an embodiment, the first surface may define a plurality of grooves surrounding each of the plurality of slot holes when viewed in the direction of the central axis, and a conductor may be provided in each of the plurality of grooves. By disposing the conductor so as to surround each of the plurality of slot holes, it is possible to concentrate an electric field immediately below the plurality of slot holes.

In an embodiment, the plurality of first regions may be arranged along the circumferential direction with respect to the central axis, and each of the plurality of first regions may be provided at a position overlapping the flat surface and the inner inclined surface when viewed in the direction parallel to the central axis. Since an electric field is concentrated immediately below the plurality of slot holes, the heat input from plasma to the inner inclined surface increases. In contrast, in the embodiment, since each of the plurality of first regions is provided at a position overlapping the flat surface and the inner inclined surface when viewed in the direction parallel to the central axis, it is possible to efficiently cool the flat surface and the inner inclined surface. Therefore, according to the antenna according to the aspect, it is possible to suppress the non-uniformity of cooling of the dielectric window during the plasma processing.

In an embodiment, the upper surface may further include a third region, the cooling jacket may be mounted on the plurality of first regions and the third region, and the third region may be formed at a position overlapping the outer inclined surface when viewed in the direction parallel to the central axis. The maximum thickness between the first surface and the second surface of the dielectric window at the position where the outer inclined surface is formed is larger than the maximum thickness between the first surface and the second surface of the dielectric window at the position where the bottom surface is formed. In contrast, in the antenna according to the embodiment, the third region is formed at a position overlapping the outer inclined surface when viewed in the direction parallel to the axis, whereby it is possible to efficiently cool the portion where the outer inclined surface is formed, of the dielectric window. Accordingly, it is possible to further suppress the non-uniformity of cooling of the dielectric window during the plasma processing.

A plasma processing apparatus according to an aspect includes a chamber body providing a chamber, a gas supply unit configured to supply a processing gas into the chamber, a stage provided in the chamber, the antenna provided above the stage, and a microwave generator connected to the antenna.

In an aspect, a plasma processing method using the plasma processing apparatus described above is provided. The plasma processing method includes heating a dielectric window by using a heater, and plasma-processing a workpiece while cooling the dielectric window by using a cooling jacket, after the heating of the dielectric window by the heater is stopped. In the plasma processing method according to the aspect, it is possible to suppress the non-uniformity of cooling of the dielectric window during the plasma processing while suppressing a difference between the temperature of the dielectric window during the plasma processing and the temperature of the dielectric window when the plasma processing is not performed.

Advantageous Effects of Invention

According to the aspects and various embodiments of the present invention, it is possible to suppress the non-uniformity of cooling of the dielectric window during the plasma processing while suppressing a difference between the temperature of the dielectric window during the plasma processing and the temperature of the dielectric window when the plasma processing is not performed.

DESCRIPTION OF EMBODIMENTS

Figure 1:
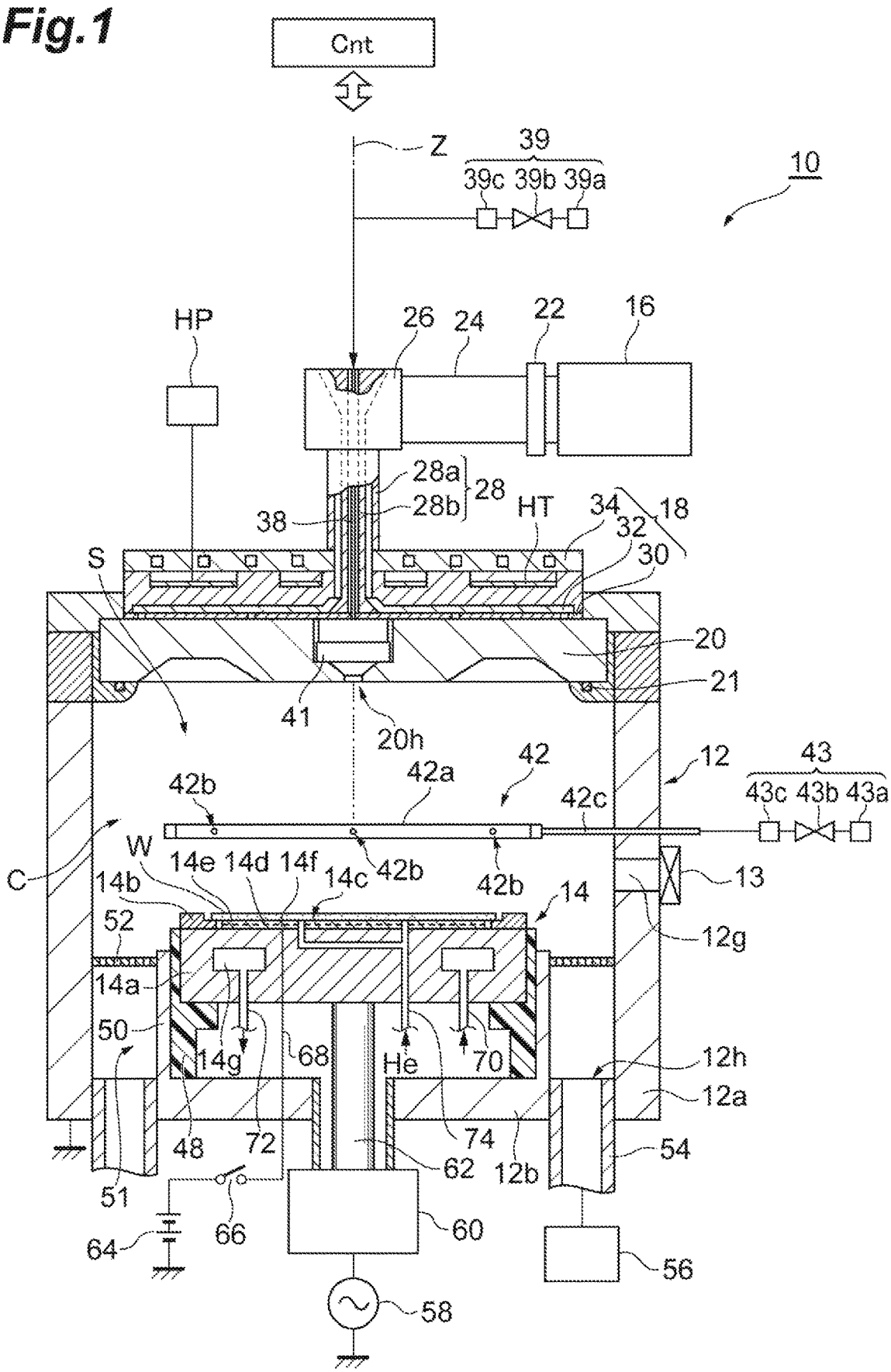
FIG. 1 is a sectional view schematically showing a plasma processing apparatus according to an embodiment.

Hereinafter, various embodiments will be described in detail with reference to the drawings. In each drawing, identical or corresponding portions are denoted by the same reference numerals, and duplicate descriptions of identical or corresponding portions are omitted. Further, the dimensional ratio of each drawing does not necessarily coincide with the actual dimensional ratio.

FIG. 1 is a diagram schematically showing a plasma processing apparatus according to an embodiment. A plasma processing apparatus 10 shown in FIG. 1 includes a chamber body 12, a stage 14, a microwave generator 16, and an antenna 18.

The chamber body 12 provides a chamber C in the interior thereof. The chamber body 12 may include a side wall 12a and a bottom portion 12b. The side wall 12a has a substantially tubular shape extending in a direction of an axis Z. The axis Z coincides with the central axis of the antenna 18. The bottom portion 12b is provided on the lower end side of the side wall 12a. An exhaust hole 12h for exhaust is provided in the bottom portion 12b. Further, a loading and unloading port 12g for a workpiece W is provided in the side wall 12a of the chamber body 12. The loading and unloading port 12g can be opened and closed by a gate valve 13. An upper end portion of the side wall 12a is open.

The stage 14 is disposed at a lower portion in the chamber C. The workpiece W is supported on the stage 14. The stage 14 may include a base 14a, a focus ring 14b, and an electrostatic chuck 14c.

The base 14a is supported by a tubular support part 48. The tubular support part 48 is made of an insulating material and extends vertically upward from the bottom portion 12b. Further, a conductive tubular support part 50 is provided at the outer periphery of the tubular support part 48. The tubular support part 50 extends vertically upward from the bottom portion 12b of the chamber body 12 along the outer periphery of the tubular support part 48. An annular exhaust path 51 is formed between the tubular support part 50 and the side wall 12a.

An annular baffle plate 52 provided with a plurality of through-holes is mounted to an upper portion of the exhaust path 51. An exhaust device 56 is connected to a lower portion of the exhaust hole 12h through an exhaust pipe 54. The exhaust device 56 has a vacuum pump such as a turbo-molecular pump. It is possible to reduce the pressure in a processing space S in the chamber body 12 to a desired degree of vacuum by the exhaust device 56.

The base 14a doubles as a high-frequency electrode. A high-frequency power source 58 for RF bias is electrically connected to the base 14a through a matching unit 60 and a power feed rod 62. The high-frequency power source 58 outputs a high frequency power with a constant frequency, for example, 13.65 MHz, suitable for controlling the energy of ions attracted to the workpiece W, with a predetermined power. The matching unit 60 accommodates a matching device for matching between the impedance on the high-frequency power source 58 side and the impedance on the load side such as mainly an electrode, plasma, and the chamber body 12. A blocking capacitor for self-bias generation is included in the matching device.

The electrostatic chuck 14c is provided on the upper surface of the base 14a. The electrostatic chuck 14c holds the workpiece W with an electrostatic attraction force. The focus ring 14b annularly surrounding the periphery of the workpiece W is provided on the outer side in a radial direction of the electrostatic chuck 14c. The electrostatic chuck 14c includes an electrode 14d, an insulating film 14e, and an insulating film 14f. The electrode 14d is formed of a conductive film and is provided between the insulating film 14e and the insulating film 14f. A high-voltage direct-current power source 64 is electrically connected to the electrode 14d through a switch 66 and a coated wire 68. The electrostatic chuck 14c can attract and hold the workpiece W with a Coulomb force which is generated by a direct-current voltage which is applied from the direct-current power source 64.

An annular refrigerant chamber 14g extending in a circumferential direction is provided in the interior of the base 14a. A refrigerant having a predetermined temperature, for example, cooling water, is circulated and supplied to the refrigerant chamber 14g from a chiller unit (not shown) through pipes 70 and 72. Due to the circulation of the refrigerant, the base 14a and the electrostatic chuck 14c are controlled to a predetermined temperature. Further, for example, He gas is supplied between the upper surface of the electrostatic chuck 14c and the back surface of the workpiece W through a gas supply pipe 74.

The microwave generator 16 generates microwaves of, for example, 2.45 GHz. In an embodiment, the plasma processing apparatus 10 further includes a tuner 22, a waveguide 24, a mode converter 26, and a coaxial waveguide 28.

The microwave generator 16 is connected to the waveguide 24 through the tuner 22. The waveguide 24 is, for example, a rectangular waveguide. The waveguide 24 is connected to the mode converter 26, and the mode converter 26 is connected to the upper end of the coaxial waveguide 28.

The coaxial waveguide 28 extends along the axis Z. The coaxial waveguide 28 includes an outer conductor 28a and an inner conductor 28b. The outer conductor 28a has a substantially cylindrical shape extending in the direction of the axis Z. The inner conductor 28b is provided in the interior of the outer conductor 28a. The inner conductor 28b has a substantially cylindrical shape extending along the axis Z.

The microwaves generated by the microwave generator 16 are guided to the mode converter 26 through the tuner 22 and the waveguide 24. The mode converter 26 converts the mode of the microwave and supplies the microwave after the mode conversion to the coaxial waveguide 28. The microwaves from the coaxial waveguide 28 are supplied to the antenna 18.

The antenna 18 emits microwaves for plasma generation, based on the microwaves which are generated by the microwave generator 16. The antenna 18 includes a dielectric window 20, a slot plate 30, a dielectric plate 32, a heat transfer member 34, and a cooling jacket 36. Details of the antenna 18 will be described later.

In an embodiment, a conduit 38 passes through an inner hole of the inner conductor 28b of the coaxial waveguide 28. The conduit 38 extends along the axis Z and is connected to a gas supply system 39.

The gas supply system 39 supplies a processing gas for processing the workpiece W to the conduit 38. The gas supply system 39 may include a gas source 39a, a valve 39b, and a flow rate controller 39c. The gas source 39a is a gas source of the processing gas. The valve 39b switches between supply and supply stop of the processing gas from the gas source 39a. The flow rate controller 39c is, for example, a mass flow controller, and adjusts the flow rate of the processing gas from the gas source 39a.

In an embodiment, the plasma processing apparatus 10 may further include a gas supply unit 42. The gas supply unit 42 supplies gas to the processing space S from the surroundings of the axis Z between the stage 14 and the antenna 18. The gas supply unit 42 may include a conduit 42a. The conduit 42a annularly extends around the axis Z between the antenna 18 and the stage 14. A plurality of gas supply holes 42b are formed in the conduit 42a. The plurality of gas supply holes 42b are annularly arranged, are open toward the axis Z, and supply the gas supplied to the conduit 42a toward the axis Z. The gas supply unit 42 is connected to a gas supply system 43 through a conduit 42c.

The gas supply system 43 supplies a processing gas for processing the workpiece W to the gas supply unit 42. The gas supply system 43 may include a gas source 43a, a valve 43*b*, and a flow rate controller 43*c*. The gas source 43*a* is a gas source of the processing gas. The valve 43*b* switches between supply and supply stop of the processing gas from the gas source 43*a*. The flow rate controller 43*c* is, for example, a mass flow controller, and adjusts the flow rate of the processing gas from the gas source 43*a*.

Figure 2:
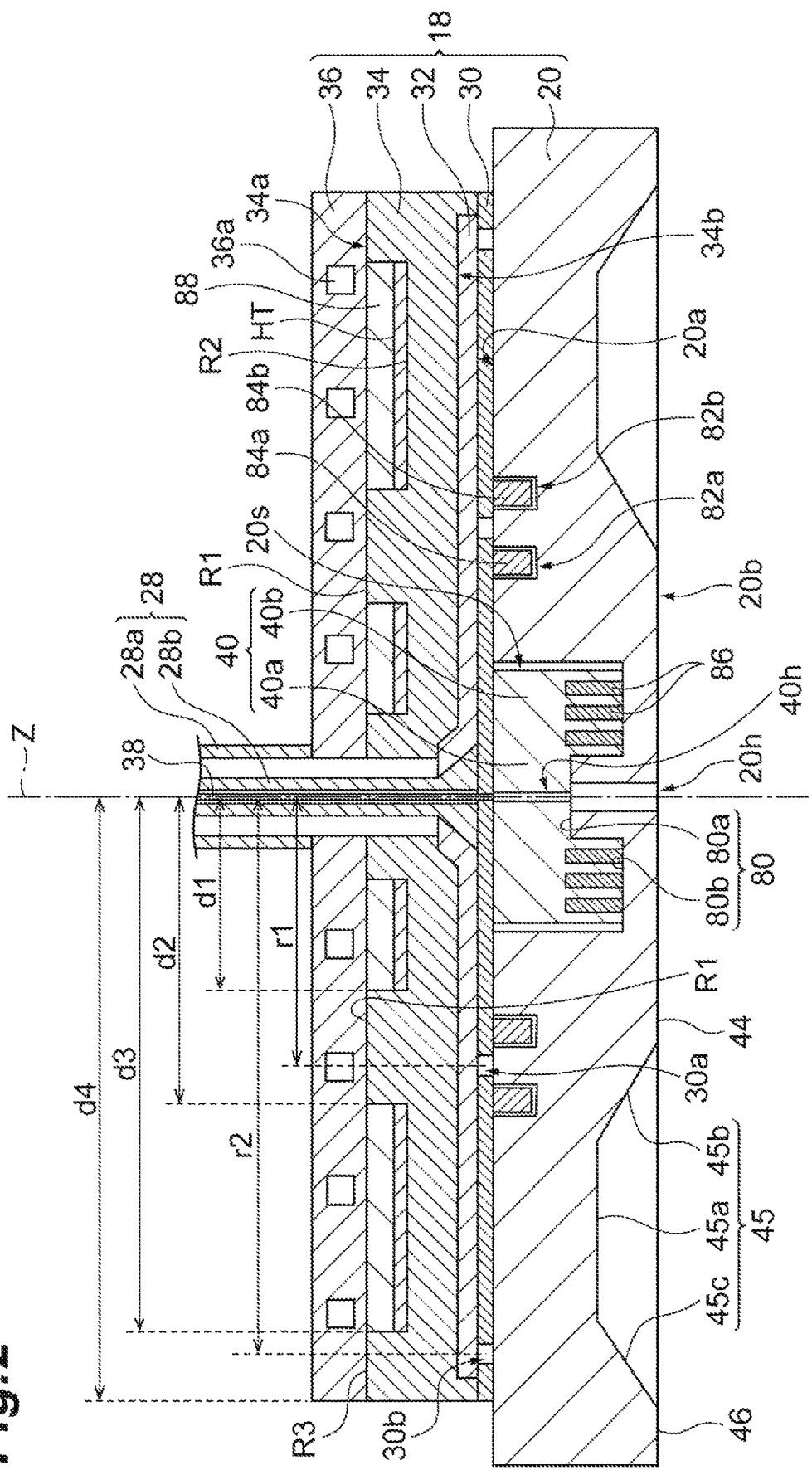
FIG. 2 is a sectional view schematically showing an antenna according to an embodiment.

Hereinafter, the antenna 18 will be described in more detail with reference to FIGS. 1 and 2. FIG. 2 is a sectional view schematically showing the antenna 18 of an embodiment. As described above, the antenna 18 includes the dielectric window 20, the slot plate 30, the dielectric plate 32, the heat transfer member 34, and the cooling jacket 36.

The dielectric window 20 is supported on the upper end portion of the side wall 12*a* so as to face the stage 14 through the processing space S in the direction of the axis Z. The upper end portion opening of the side wall 12*a* is closed by the dielectric window 20. The dielectric window 20 has a substantially disc shape and is made of, for example, ceramics. An O-ring 21 may be interposed between the dielectric window 20 and the upper end portion of the side wall 12*a*. The O-ring 21 makes the sealing of the chamber body 12 more reliable.

The dielectric window 20 includes a first surface 20*a* and a second surface 20*b*. The second surface 20*b* extends on the side opposite to the first surface 20*a* and is exposed to the processing space S.

In an embodiment, the first surface 20*a* of the dielectric window 20 may define a recessed surface 80 recessed toward the second surface 20*b* side in the central region in the radial direction. The recessed surface 80 includes a first bottom surface 80*a* and a second bottom surface 80*b*. The first bottom surface 80*a* has a circular planar shape in which the center thereof coincides with the axis Z. A through-hole 20*h* penetrating the dielectric window 20 is formed between the first bottom surface 80*a* and the second surface 20*b*. The through-hole 20*h* extends along the axis Z. The second bottom surface 80*b* has an annular shape surrounding the first bottom surface 80*a* when viewed in the direction parallel to the axis Z. The second bottom surface 80*b* is located further on the second surface 20*b* side than the first bottom surface 80*a*. Therefore, a step is formed between the first bottom surface 80*a* and the second bottom surface 80*b*. The recessed surface 80 defines an accommodation space 20*s*.

An injector 40 is accommodated in the accommodation space 20*s*. The injector 40 has a function of supplying the gas from the conduit 38 to the through-hole 20*h* formed in the dielectric window 20. The injector 40 is made of, for example, aluminum or stainless steel. The injector 40 may include a main body portion 40*a* and a side portion 40*b*. The main body portion 40*a* and the side portion 40*b* may be integrally formed. The main body portion 40*a* has a substantially columnar shape in which the central axis thereof coincides with the axis Z, and is provided on the first bottom surface 80*a*. A through-hole 40*h* extending in the direction of the axis Z is formed in the main body portion 40*a*. The through-hole 40*h* communicates with the conduit 38 and the through-hole 20*h*. The side portion 40*b* has an annular shape centered on the axis Z and is provided on the second bottom surface 80*b*. The side portion 40*b* is continuous with the outer edge surface of the main body portion 40*a* so as to surround the main body portion 40*a*. The side portion 40*b* has a function of shielding microwaves propagating through the interior of the dielectric window 20 from the outer edge of the dielectric window 20 toward the central region.

A choke 86 is provided in the interior of the injector 40. In the embodiment shown in FIGS. 1 and 2, the plasma processing apparatus 10 is provided with a plurality of chokes 86, specifically, three chokes 86. The choke 86 has an annular shape centered on the axis Z and is made of, for example, a dielectric such as quartz or ceramics. In an embodiment, the choke 86 may be made of the same material as the dielectric window 20. The choke 86 has a function of suppressing microwaves propagating from the peripheral region of the dielectric window 20 to the central region.

The choke 86 is provided in the interior of the side portion 40*b* so as to surround the through-hole 20*h*. In an embodiment, the choke 86 is embedded in the side portion 40*b* in a state where one end surface thereof is exposed from the lower surface of the side portion 40*b*. One end surface of the choke 86 is in contact with the second bottom surface 80*b* of the dielectric window 20. The length between one end surface and the other end surface of the choke 86, that is, the length of the choke 86 in the direction parallel to the axis Z is set to about ¼ of the wavelength of the microwave propagating through the dielectric window 20.

The choke 86 propagates some of the microwaves, that is, the incident waves, propagating through the interior of the dielectric window 20 from one end surface which is in contact with the second bottom surface 80*b* to the other end surface which is located on the slot plate 30 side. Some of the incident waves are reflected by the other end surface of the choke 86 and returned to the dielectric window 20 as reflected waves. The choke 86 has a length of about ¼ of the wavelength of the microwave propagating through the dielectric window 20. Therefore, the choke 86 returns a reflected wave having a phase difference of an approximately half wavelength with respect to the incident wave to the dielectric window 20. In the plasma processing apparatus 10, the reflected wave interferes with the incident wave, whereby the incident wave is attenuated or canceled. Therefore, in the antenna 18 of an embodiment, it is possible to reduce the electric field strength in the through-hole 20*h* of the dielectric window 20, and as a result, it is possible to prevent the occurrence of abnormal discharge in the through-hole 20*h*.

Further, in an embodiment, the first surface 20*a* of the dielectric window 20 may further define two annular grooves 82*a* and 82*b*. The grooves 82*a* and 82*b* have a concentric circular shape centered on the axis Z when viewed in the direction parallel to the axis Z. Two annular conductors 84*a* and 84*b* are respectively provided in the interiors of the grooves 82*a* and 82*b*. The conductors 84*a* and 84*b* are made of, for example, metal and are electrically connected to the slot plate 30. The conductors 84*a* and 84*b* may be formed integrally with the slot plate 30.

In an embodiment, the second surface 20*b* of the dielectric window 20 may include a flat surface 44, a recessed surface 45, and an outer edge surface 46. The flat surface 44 is a flat surface orthogonal to the central axis of the antenna 18, that is, the axis Z, and is provided in the central region in the radial direction of the second surface 20*b*. The recessed surface 45 extends annularly when viewed in the direction parallel to the axis Z, and the central axis thereof coincides with the axis Z. The recessed surface 45 is formed to surround the flat surface 44. The outer edge surface 46 has an annular shape coaxial with the recessed surface 45 and is provided on the outer side in the radial direction of the recessed surface 45. The outer edge surface 46 configures the outer edge of the second surface 20*b*.

The recessed surface 45 includes a bottom surface 45*a*, an inner inclined surface 45*b*, and an outer inclined surface 45*c*. The bottom surface 45*a* is a flat surface perpendicular to the axis Z and faces the first surface 20a. The inner inclined surface 45b connects the bottom surface 45a and the flat surface 44. The inner inclined surface 45b is inclined to become more distant from the first surface 20a as it comes closer to the flat surface 44 from the bottom surface 45a. The outer inclined surface 45c connects the bottom surface 45a and the outer edge surface 46. The outer inclined surface 45c is inclined to become more distant from the first surface 20a as it comes closer to the outer edge surface 46 from the bottom surface 45a.

Figure 3:
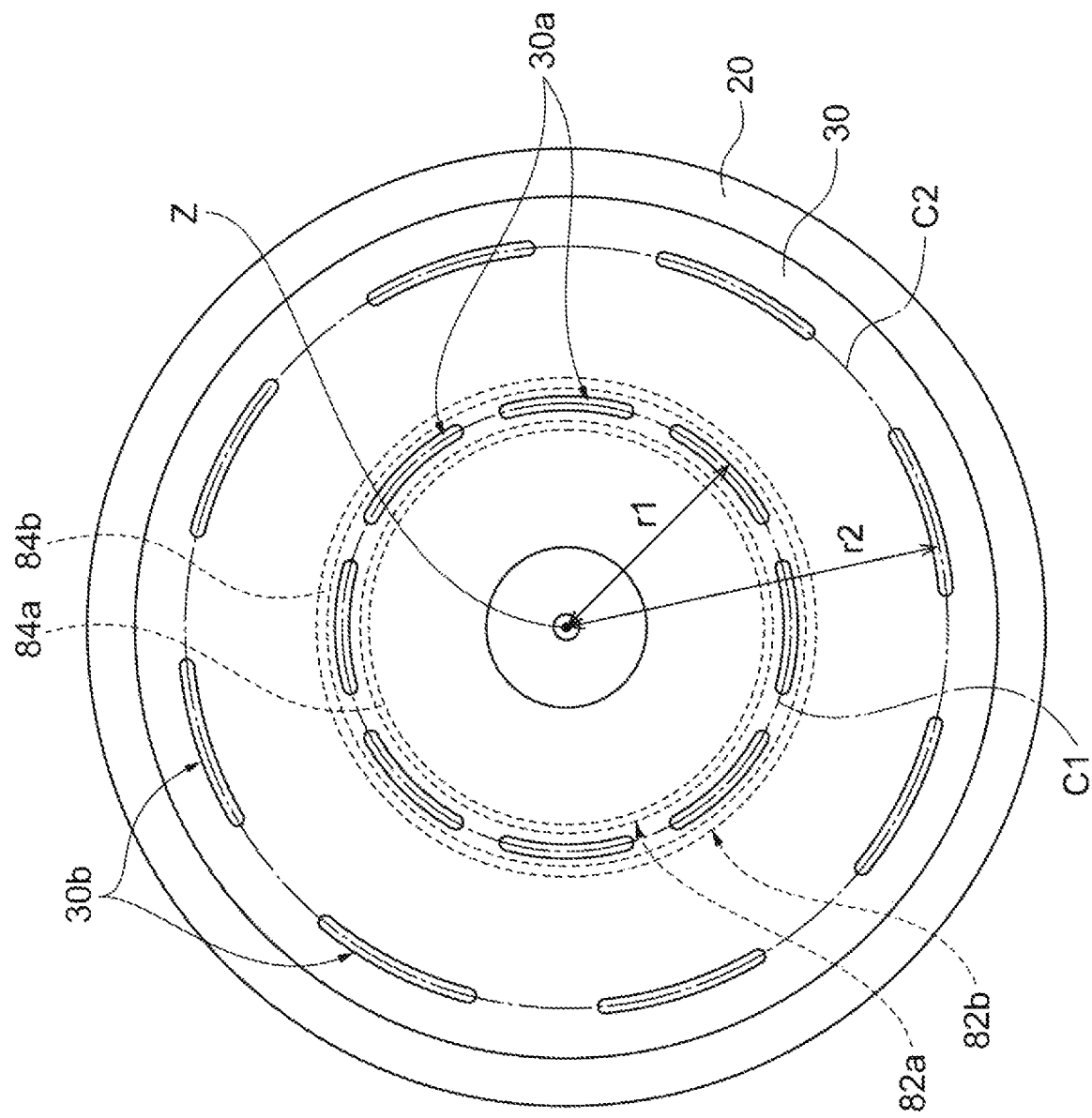
FIG. 3 is a plan view of a slot plate shown in FIG. 2, as viewed from above.

The slot plate 30 is provided on the first surface 20a of the dielectric window 20. In an embodiment, the slot plate 30 may be a slot plate configuring a radial line slot antenna. The slot plate 30 is configured with a metal disc having electrical conductivity. FIG. 3 is a plan view of the slot plate 30 according to an embodiment, as viewed from above.

As shown in FIG. 3, a plurality of slot holes 30a and a plurality of slot holes 30b are formed in the slot plate 30. The plurality of slot holes 30a are arranged along a circle C1 having a radius r1 centered on the axis Z. Each of the plurality of slot holes 30a has an elongated hole shape extending along the circle C1. In an embodiment, the radius r1 of the circle C1 is larger than the distance in the radial direction from the axis Z to the boundary between the flat surface 44 and the inner inclined surface 45b and smaller than the distance in the radial direction from the axis Z to the boundary between the bottom surface 45a and the inner inclined surface 45b. That is, as shown in FIG. 2, each of the plurality of slot holes 30a is formed at a position overlapping the inner inclined surface 45b when viewed in the radial direction with respect to the axis Z.

The plurality of slot holes 30b are arranged along a circle C2 centered on the axis Z. The circle C2 has a radius r2 larger than the radius r1 of the circle C1. Each of the plurality of slot holes 30b has an elongated hole shape extending along the circle C2. The radius r2 of the circle C2 is larger than the distance in the radial direction from the axis Z to the boundary between the bottom surface 45a and the outer inclined surface 45c and smaller than the distance in the radial direction from the axis Z to the boundary between the outer inclined surface 45c and the outer edge surface 46. That is, as shown in FIG. 2, each of the plurality of slot holes 30b is formed at a position overlapping the outer inclined surface 45c when viewed in the radial direction with respect to the axis Z.

In an embodiment, as shown in FIG. 3, the two annular grooves 82a and 82b formed in the first surface 20a may extend to surround the plurality of slot holes 30a when viewed in the direction parallel to the axis Z. That is, the two conductors 84a and 84b respectively provided in the grooves 82a and 82b extend along the inner edge portions in the radial direction and the outer edge portions in the radial direction of the plurality of slot holes 30a. In this manner, the two conductors 84a and 84b are disposed below the plurality of slot holes 30a so as to interpose the plurality of slot holes 30a therebetween. By disposing the two conductors 84a and 84b in this manner, it is possible to concentrate an electric field immediately below the plurality of slot holes 30a.

Referring to FIG. 2 again, the dielectric plate 32 is provided on the slot plate 30. The dielectric plate 32 is made of, for example, quartz or alumina, and has a substantially disc shape. The dielectric plate 32 has a function of shortening the wavelength of the microwave.

The heat transfer member 34 is provided on the dielectric plate 32. The heat transfer member 34 is made of metal having high thermal conductivity, such as aluminum, and has a circular planar shape centered on the axis Z. The heat transfer member 34 includes an upper surface 34a and a lower surface 34b facing away from each other. The heat transfer member 34 sandwiches the dielectric plate 32 between the lower surface 34b and the slot plate 30. The cooling jacket 36 is provided on the upper surface 34a of the heat transfer member 34, The surface of the cooling jacket 36 may have electrical conductivity. A flow path 36a for a refrigerant is formed in the cooling jacket 36. A refrigerant having a predetermined temperature, for example, cooling water, is circulated and supplied to the flow path 36a from a chiller unit. Due to the circulation of the refrigerant, the dielectric window 20 is cooled through the heat transfer member 34, the dielectric plate 32, and the slot plate 30. The lower end of the outer conductor 28a is electrically connected to the upper surface of the cooling jacket 36. Further, the lower end of the inner conductor 28b is electrically connected to the slot plate 30 through holes formed in the central portions of the cooling jacket 36 and the dielectric plate 32. The microwaves from the coaxial waveguide 28 are propagated to the dielectric plate 32 and introduced into the processing space S from the slots of the slot plate 30 through the dielectric window 20.

Figure 4:
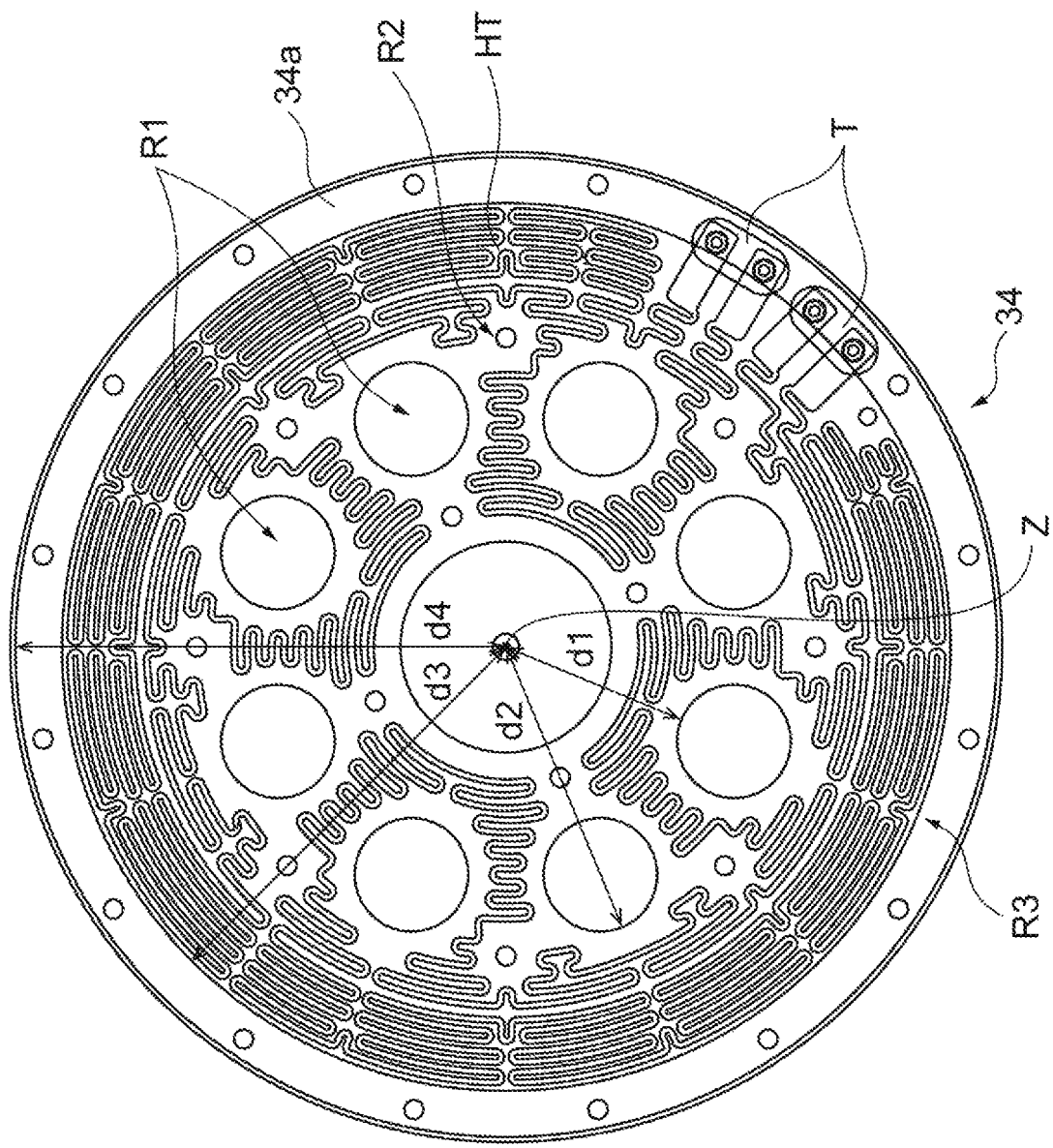
FIG. 4 is a plan view of a heat transfer member shown in FIG. 2, as viewed from above.

The heat transfer member 34 will be described in detail with reference to FIGS. 2 and 4. FIG. 4 is a plan view of the heat transfer member 34, as viewed from above. The upper surface 34a of the heat transfer member 34 includes a plurality of first regions R1, a second region R2, and a third region R3. In an embodiment, as shown in FIG. 4, the plurality of first regions R1 of the heat transfer member 34 each have a circular planar shape and may be arranged along the circumferential direction with respect to the axis Z. As shown in FIG. 2, the cooling jacket 36 is mounted on the plurality of first regions R1. That is, the first regions R1 may be in contact with the lower surface of the cooling jacket 36. Here, a shortest distance d1 in the radial direction between the axis Z and each of the plurality of first regions R1 is set to be smaller than the distance in the radial direction from the axis Z to the boundary between the flat surface 44 and the inner inclined surface 45b. That is, each of the plurality of first regions R1 is provided at a position at least partially overlapping the flat surface 44 when viewed in the direction parallel to the axis Z. Further, in an embodiment, a maximum distance d2 in the radial direction between the axis Z and each of the plurality of first regions R1 may be set to be larger than the distance in the radial direction from the axis Z to the boundary between the flat surface 44 and the inner inclined surface 45b and smaller than the distance in the radial direction from the axis Z to the boundary between the inner inclined surface 45b and the bottom surface 45a. That is, each of the plurality of first regions R1 may be provided at a position overlapping the flat surface 44 and the inner inclined surface 45b when viewed in the direction parallel to the axis Z.

The third region R3 has an annular planar shape centered on the axis Z and may extend along the outer edge of the upper surface 34a. As shown in FIG. 2, the cooling jacket 36 is mounted on the third region R3. That is, the third region R3 may be in contact with the lower surface of the cooling jacket 36. A shortest distance d3 in the radial direction between the axis Z and the third region R3 is set to be larger than the distance in the radial direction from the axis Z to the boundary between the bottom surface 45a and the outer inclined surface 45c. Further, a maximum distance d4 in the radial direction between the axis Z and the third region R3 is set to be smaller than the distance in the radial direction from the axis Z to the boundary between the outer inclined surface 45c and the outer edge surface 46. That is, the third region R3 is provided at a position overlapping the outer inclined surface 45c when viewed in the direction parallel to the axis Z.

As shown in FIG. 4, the second region R2 is provided at a position excluding the plurality of first regions R1 and the third region R3 in the upper surface 34a. The second region R2 is located further on the lower surface 34b side than the plurality of first regions R1 and the third region R3. That is, the second region R2 is recessed further toward the lower surface 34b side than the plurality of first regions R1 and the third region R3 and is separated from the cooling jacket 36.

The antenna 18 further includes a heater HT. The heater HT is provided between the heat transfer member 34 and the cooling jacket 36. Specifically, as shown in FIG. 4, the heater HT is provided on the second region R2 so as to cover substantially the entire region of the second region R2. That is, the heater HT is mounted on the second region R2. The heater HT is electrically connected to a heater power supply HP through a terminal T. The heater HT generates heat by the electric power supplied from the heater power supply HP. The heat generated in the heater HT is transmitted to the dielectric window 20 through the heat transfer member 34, the dielectric plate 32, and the slot plate 30 and heats the dielectric window 20.

As shown in FIG. 2, a member 88 may be provided between the heater HT and the cooling jacket 36. The member 88 sandwiches the heater HT between the member 88 and the second region R2 of the upper surface 34a. The member 88 is made of metal such as aluminum, for example. The upper surface of the member 88 provides a support surface for the cooling jacket 36 together with the first region R1 and the third region R3.

In an embodiment, the plasma processing apparatus 10 may further include a control unit Cnt. The control unit Cnt is configured with a computer device which includes a processor, a storage unit, and the like, or the like. The control unit Cnt can output various control signals according to a program stored in the storage unit. Various control signals from the control unit Cnt are provided to the microwave generator 16, the exhaust device 56, the valve 39b, the flow rate controller 39c, the valve 43b, the flow rate controller 43c, and the heater power supply HP. More specifically, the control unit Cnt outputs, to the microwave generator 16, a control signal for setting the microwave generator 16 to an operating state. Further, the control unit Cnt also provides a control signal to each of the valve 39b and the valve 43b such that the valve 39b and the valve 43b are opened. Further, the control unit Cnt provides a control signal to the flow rate controller 39c so as to adjust the flow rate of the gas from the gas source 39a to a predetermined flow rate, and provides a control signal to the flow rate controller 43c so as to adjust the flow rate of the gas from the gas source 43a to a predetermined flow rate. Further, the control unit Cnt outputs, to the exhaust device 56, a control signal for adjusting the exhaust amount of the exhaust device 56. Further, the control unit Cnt outputs, to the heater power supply HP, a control signal for adjusting the electric power which is applied from the heater power supply HP to the heater HT, in order to control the amount of heat generation of the heater HT.

In the plasma processing apparatus 10 of an embodiment, when the plasma processing is not performed, electric power is applied from the heater power supply HP to the heater HT. The heat generated in the heater HT by the application of the electric power is transmitted to the dielectric window 20 through the heat transfer member 34, the dielectric plate 32, and the slot plate 30 and heats the dielectric window 20. In this way, lowering of the temperature of the dielectric window 20 when the plasma processing is not performed is suppressed. Accordingly, a difference between the temperature of the dielectric window 20 during the plasma processing and the temperature of the dielectric window 20 when the plasma processing is not performed is suppressed.

On the other hand, in the plasma processing apparatus 10, during the plasma processing, the dielectric window 20 is cooled by the cooling jacket 36. Here, the maximum thickness of the dielectric window 20 at the position where the flat surface 44 is formed is larger than the maximum thickness of the dielectric window 20 at the position where the recessed surface 45 is formed. For this reason, the portion of the dielectric window 20, which overlaps the flat surface 44 when viewed in the direction parallel to the axis Z, is harder to change in temperature than the portion of the dielectric window 20, which overlaps the recessed surface 35 when viewed in the direction parallel to the axis Z. Further, in the plasma processing apparatus 10, an electric field is concentrated immediately below the plurality of slot holes 30a due to the influence of the conductors 84a and 84b. For this reason, the heat input from the plasma is increased on the inner inclined surface 45b. Therefore, if the dielectric window 20 is uniformly cooled, the temperature of the portion of the dielectric window 20, which overlaps the flat surface 44 and the inner inclined surface 45b when viewed in the direction parallel to the axis Z, becomes higher than the temperature of the other portion, and thus there is a concern that the temperature distribution of the dielectric window 20 may become uneven. In contrast, in the plasma processing apparatus 10, since the cooling jacket 36 is mounted on each of the plurality of first regions R1, the regions below the plurality of first regions R1, of the dielectric window 20, that is, the regions overlapping the flat surface 44 and the inner inclined surface 45b when viewed in the direction parallel to the axis Z, are efficiently cooled. Therefore, according to the antenna 18, it is possible to suppress the non-uniformity of the cooling of the dielectric window 20 during the plasma processing.

Further, in the plasma processing apparatus 10, since an electric field is also concentrated immediately below the plurality of slot holes 30b, the heat input from the plasma to the outer inclined surface 45c is large. In contrast, in the plasma processing apparatus 10, since the cooling jacket 36 is mounted on each of the plurality of third regions R3, the portion below the plurality of third regions R3, of the dielectric window 20, that is, the portion overlapping the outer inclined surface 45c when viewed in the direction parallel to the axis Z, is efficiently cooled. Accordingly, it is possible to further suppress the non-uniformity of the cooling of the dielectric window 20 during the plasma processing.

Figure 5:
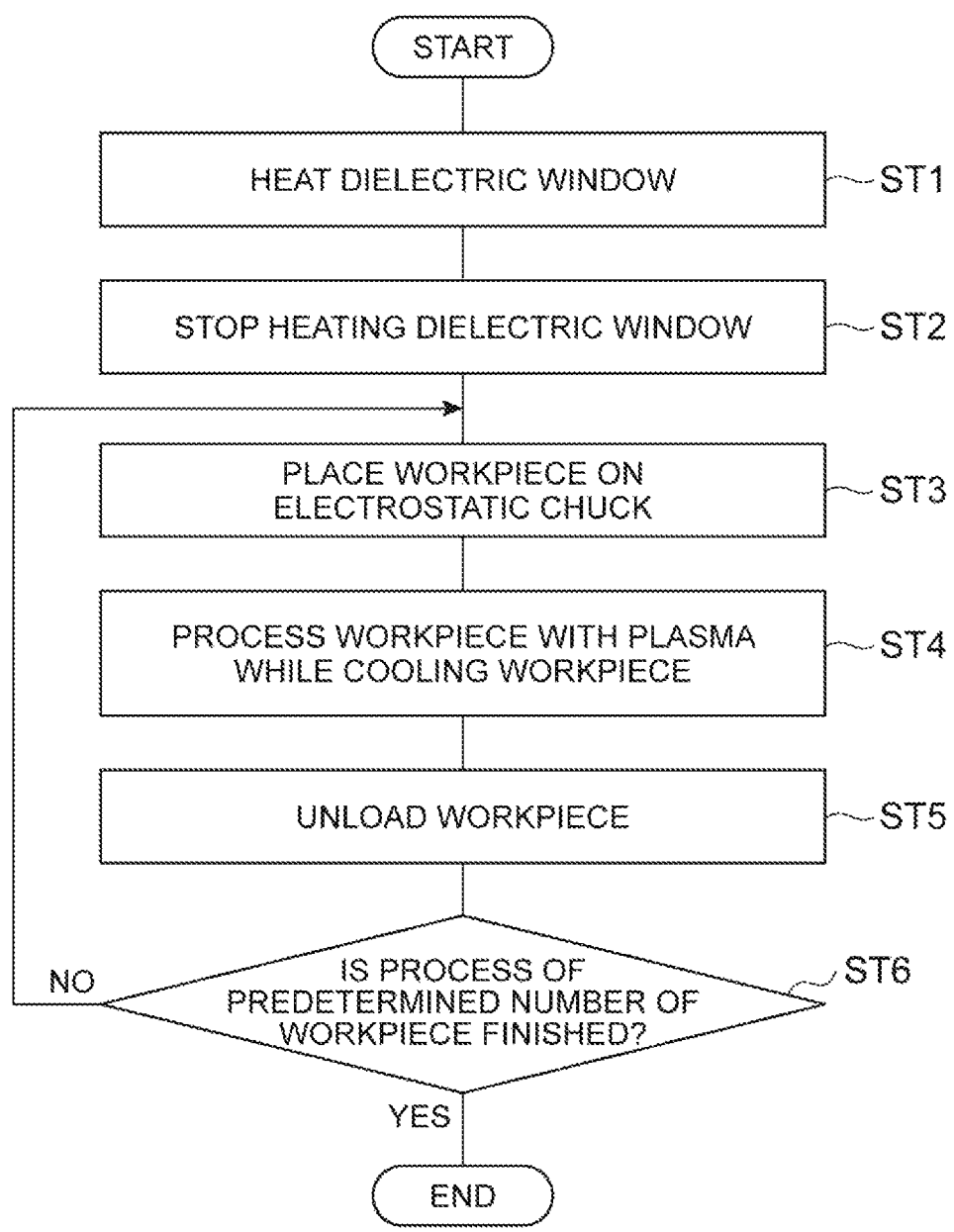
FIG. 5 is a flowchart showing a plasma processing method according to an embodiment.

Next, a plasma processing method of an embodiment using the plasma processing apparatus 10 described above will be described. FIG. 5 is a flowchart showing the plasma processing method of an embodiment. Each step of the plasma processing method shown in FIG. 5 is executed, for example, by sending a control signal from the control unit Cnt to each part of the plasma processing apparatus 10. In the plasma processing method of an embodiment, as shown in FIG. 5, first, in step ST1, the dielectric window 20 is heated by the heater HT. This heating is executed before the plasma processing of the workpiece W is started.

After the dielectric window 20 is heated to a predetermined temperature in step ST1, or after a heating time of the dielectric window 20 reaches a predetermined time in step ST1, step ST2 is performed. In step ST2, the heating of the dielectric window 20 by the heater HT is stopped. Step ST2 may be performed between step ST3 and step ST4, which will be described later.

Subsequently, step ST3 is performed. In step ST3, the workpiece W is loaded in the chamber C through the loading and unloading port 12g and the workpiece W is placed on the electrostatic chuck 14c. Subsequently, step ST4 is performed. In step ST4, the workpiece W is plasma-processed while the dielectric window 20 is cooled by the cooling jacket 36. At this time, the regions below the plurality of first regions R1, of the dielectric window 20, that is, the regions overlapping the flat surface 44 and the inner inclined surface 45b when viewed in the direction parallel to the axis Z, are efficiently cooled. Subsequently, step ST5 is performed. In step ST5, the workpiece W is unloaded through the loading and unloading port 12g.

Subsequently, step ST6 is performed. In step ST6, whether or not the plasma processing of a predetermined number of workpieces W is ended is determined. In a case where the plasma processing of a predetermined number of workpieces W is not ended, steps ST3 to ST5 are repeatedly executed until the plasma processing of a predetermined number of workpieces W is ended. On the other hand, in a case where the plasma processing of a predetermined number of workpieces W has been ended, the plasma processing method of an embodiment is ended.

Figure 6:
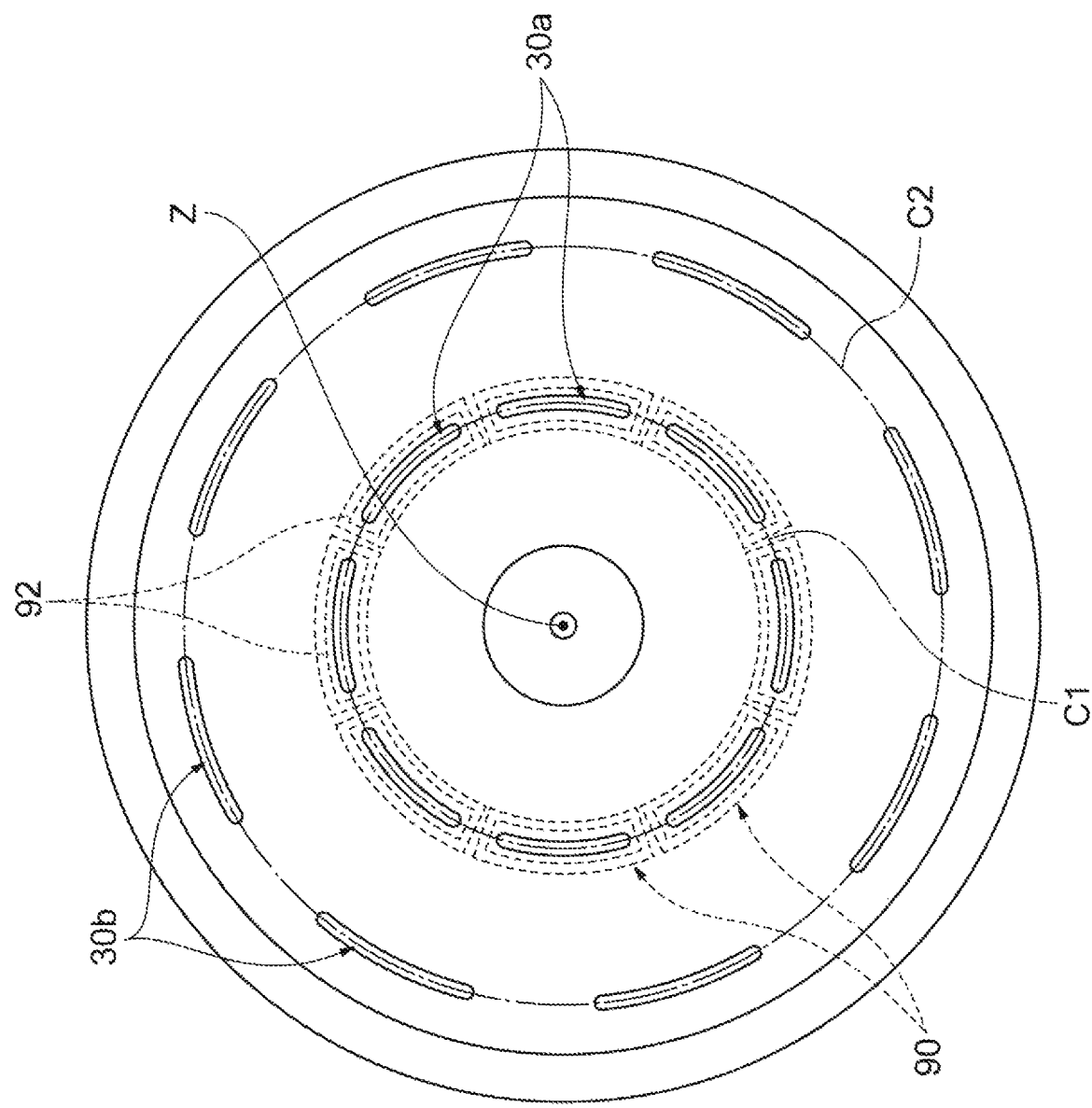
FIG. 6 is a plan view of a slot plate according to another embodiment, as viewed from above.

The embodiment has been described above. However, various modifications can be made without being limited to the embodiment described above. For example, in an embodiment shown in FIG. 3, the two annular grooves 82a and 82b extending to surround the plurality of slot holes 30a when viewed in the direction parallel to the axis Z are defined in the first surface 20a of the dielectric window 20, and the annular conductors 84a and 84b are respectively provided in the interiors of the two annular grooves 82a and 82b. However, in an embodiment, as shown in FIG. 6, a configuration may be made such that a plurality of grooves 90 are defined in the first surface 20a of the dielectric window 20 so as to surround each of the plurality of slot holes 30a when viewed in the direction of the axis Z and a conductor 92 is provided in the interior of each of the plurality of grooves. The antenna 18 is provided with the plurality of conductors 92, whereby it is possible to concentrate an electric field immediately below the plurality of slot holes 30a.

Further, in the embodiment described above, the upper surface 34a of the heat transfer member 34 includes the plurality of first regions R1, the second region R2, and the third region R3. However, the upper surface 34a may include at least the plurality of first regions R1 and the second region R2, and the upper surface 34a may not include the third region R3. For example, the second region R2 may extend to the position of the third region R3, that is, to the outer edge of the upper surface 34a.

REFERENCE SIGNS LIST

10: plasma processing apparatus, 12: chamber body, 12a: side wall, 12b: bottom portion, 12g: loading and unloading port, 12h: exhaust hole, 13: gate valve, 14: stage, 16: microwave generator, 18: antenna, 20: dielectric window, 20a: first surface, 20b: second surface, 30: slot plate, 30a, 30b: slot hole, 32: dielectric plate, 34: heat transfer member, 34a: upper surface, 34b: lower surface, 36: cooling jacket, 36a: flow path, 39: gas supply system, 40: injector, 43: gas supply system, 44: flat surface, 45: recessed surface, 45a: bottom surface, 45b: inner inclined surface, 45c: outer inclined surface, 46: outer edge surface, 82a, 82b, 90: groove, 84a, 84b, 92: conductor, 86: choke, C1, C2: circle, Cnt: control unit, HT: heater, R1: first region, R2: second region, R3: third region, S: processing space, W: workpiece, Z: axis.

The invention claimed is:

1. An antenna comprising:
   a dielectric window having a first surface and a second surface extending on a side opposite to the first surface, the second surface having an annular recessed surface extending around a central axis and recessed toward the first surface, and a flat surface surrounded by the annular recessed surface;
   a slot plate provided on the first surface;
   a dielectric plate provided on the slot plate;
   a heat transfer member made of metal, having an upper surface and a lower surface opposing to each other, and sandwiching the dielectric plate between the lower surface and the slot plate;
   a cooling jacket provided on the heat transfer member; and
   a heater provided between the heat transfer member and the cooling jacket,
   wherein the upper surface includes a plurality of first regions and a second region,
   the cooling jacket is mounted on the plurality of first regions,
   the second region is recessed further toward the lower surface than the plurality of first regions,
   the heater is mounted on the second region, and
   each of the plurality of first regions is provided at a position at least partially overlapping the flat surface when viewed in a direction parallel to the central axis.

2. The antenna according to claim 1, wherein the annular recessed surface includes a bottom surface, an inner inclined surface connecting the bottom surface and the flat surface and inclined to become more distant from the first surface as it comes closer to the flat surface, and an outer inclined surface extending from the bottom surface to an outer side and inclined to become more distant from the first surface as it comes closer to an outer edge of the dielectric window, and
   a plurality of slot holes arranged in a circumferential direction with respect to the central axis are formed in the slot plate, each of the plurality of slot holes being formed at a position overlapping the inner inclined surface when viewed in the direction parallel to the central axis.

3. The antenna according to claim 2, wherein the first surface defines two annular grooves extending to surround the plurality of slot holes when viewed in the direction parallel to the central axis, and an annular conductor is provided in each of the two annular grooves.

4. The antenna according to claim 2, wherein the first surface defines a plurality of grooves surrounding each of the plurality of slot holes when viewed in the direction parallel to the central axis, and a conductor is provided in each of the plurality of grooves.

5. The antenna according to claim 2, wherein the plurality of first regions are arranged along the circumferential direction with respect to the central axis, and each of the plurality of first regions is provided at a position overlapping the flat surface and the inner inclined surface when viewed in the direction parallel to the central axis.

6. The antenna according to claim 2, wherein the upper surface further includes a third region, the cooling jacket is mounted on the plurality of first regions and the third region, and the third region is formed at a position overlapping the outer inclined surface when viewed in the direction parallel to the central axis.

7. A plasma processing apparatus comprising:
a chamber body providing a chamber;
a gas supply unit configured to supply a processing gas into the chamber;
a stage provided in the chamber;
the antenna according to claim 1, which is provided above the stage; and
a microwave generator connected to the antenna.

8. A plasma processing method performed by a plasma processing apparatus having an antenna, the plasma processing method comprising:
heating a dielectric window of the antenna by using a heater, the antenna including the dielectric window having a first surface and a second surface extending on a side opposite to the first surface, the second surface having an annular recessed surface extending around a central axis and recessed toward the first surface, and a flat surface surrounded by the annular recessed surface, a slot plate provided on the first surface, a dielectric plate provided on the slot plate, a heat transfer member made of metal, having an upper surface and a lower surface opposing to each other, and sandwiching the dielectric plate between the lower surface and the slot plate, a cooling jacket provided on the heat transfer member; and the heater provided between the heat transfer member and the cooling jacket, the upper surface including a plurality of first regions and a second region, the cooling jacket being mounted on the plurality of first regions, the second region being recessed further toward the lower surface than the plurality of first regions, the heater being mounted on the second region, and each of the plurality of first regions being provided at a position at least partially overlapping the flat surface when viewed in a direction parallel to the central axis; and
plasma-processing a workpiece while cooling the dielectric window by using the cooling jacket, after the heating of the dielectric window by the heater is stopped.

9. The antenna according to claim 3, wherein the plurality of first regions are arranged along the circumferential direction with respect to the central axis, and each of the plurality of first regions is provided at a position overlapping the flat surface and the inner inclined surface when viewed in the direction parallel to the central axis.

10. The antenna according to claim 4, wherein the plurality of first regions are arranged along the circumferential direction with respect to the central axis, and each of the plurality of first regions is provided at a position overlapping the flat surface and the inner inclined surface when viewed in the direction parallel to the central axis.

11. The antenna according to claim 3, wherein the upper surface further includes a third region,
the cooling jacket is mounted on the plurality of first regions and the third region, and
the third region is formed at a position overlapping the outer inclined surface when viewed in the direction parallel to the central axis.

12. The antenna according to claim 4, wherein the upper surface further includes a third region,
the cooling jacket is mounted on the plurality of first regions and the third region, and
the third region is formed at a position overlapping the outer inclined surface when viewed in the direction parallel to the central axis.

13. The antenna according to claim 5, wherein the upper surface further includes a third region,
the cooling jacket is mounted on the plurality of first regions and the third region, and
the third region is formed at a position overlapping the outer inclined surface when viewed in the direction parallel to the central axis.

14. A plasma processing apparatus comprising:
a chamber body providing a chamber;
a gas supply unit configured to supply a processing gas into the chamber;
a stage provided in the chamber;
the antenna according to claim 2, which is provided above the stage; and
a microwave generator connected to the antenna.

15. A plasma processing apparatus comprising:
a chamber body providing a chamber;
a gas supply unit configured to supply a processing gas into the chamber;
a stage provided in the chamber;
the antenna according to claim 3, which is provided above the stage; and
a microwave generator connected to the antenna.

16. A plasma processing apparatus comprising:
a chamber body providing a chamber;
a gas supply unit configured to supply a processing gas into the chamber;
a stage provided in the chamber;
the antenna according to claim 4, which is provided above the stage; and
a microwave generator connected to the antenna.

17. A plasma processing apparatus comprising:
a chamber body providing a chamber;
a gas supply unit configured to supply a processing gas into the chamber;
a stage provided in the chamber;
the antenna according to claim 5, which is provided above the stage; and
a microwave generator connected to the antenna.

18. A plasma processing apparatus comprising:
a chamber body providing a chamber;
a gas supply unit configured to supply a processing gas into the chamber;
a stage provided in the chamber;
the antenna according to claim 6, which is provided above the stage; and
a microwave generator connected to the antenna.

* * * * *